(12) United States Patent
Kano

(10) Patent No.: US 9,144,164 B2
(45) Date of Patent: Sep. 22, 2015

(54) PRINTER AND PRINTING SYSTEM

(71) Applicant: SEIKO EPSON CORPORATION, Tokyo (JP)

(72) Inventor: Tomohisa Kano, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/327,526

(22) Filed: Jul. 9, 2014

(65) Prior Publication Data

US 2015/0022610 A1 Jan. 22, 2015

(30) Foreign Application Priority Data

Jul. 19, 2013 (JP) ................................. 2013-150219
Jul. 22, 2013 (JP) ................................. 2013-151389

(51) Int. Cl.
*B41J 29/13* (2006.01)
*H05K 5/03* (2006.01)
*B41J 23/00* (2006.01)

(52) U.S. Cl.
CPC . *H05K 5/03* (2013.01); *B41J 23/00* (2013.01); *B41J 29/13* (2013.01)

(58) Field of Classification Search
USPC .......................................... 347/108; 200/333
See application file for complete search history.

(56) References Cited

U.S. PATENT DOCUMENTS

| | | | | |
|---|---|---|---|---|
| 4,749,101 A | * | 6/1988 | Durkan, Jr. | 220/840 |
| 4,898,009 A | * | 2/1990 | Lakoski et al. | 70/58 |
| 6,422,675 B1 | * | 7/2002 | Tomomatsu | 347/7 |
| 2002/0056630 A1 | * | 5/2002 | Horiguchi et al. | 200/333 |

FOREIGN PATENT DOCUMENTS

| | | |
|---|---|---|
| JP | 11317123 A | 11/1999 |
| JP | 2004341947 A | 12/2004 |
| JP | 2006216484 A | 8/2006 |
| JP | 200821436 A | 1/2008 |
| JP | 2008171303 A | 7/2008 |

* cited by examiner

*Primary Examiner* — Stephen Meier
*Assistant Examiner* — Alexander D Shenderov
(74) *Attorney, Agent, or Firm* — Lowe Hauptman & Ham, LLP

(57) ABSTRACT

A switch cover 21 has a frame member 22 and a cover member 23. The frame member 22 is fastened to the case front 6 of a printer 1 and surrounds a power switch 15. The cover member 23 is supported by the frame member 22 pivotably between a closed position 23A covering the opening 24 inside the frame member 22 and shielding the power switch 15 so the power switch 15 is inoperable, and an open position 23B where the opening 24 is open and the power switch 15 is not shielded. By simply fastening the switch cover 21 to the case front 6 with the frame member 22 surrounding the power switch 15, the cover member 23 can cover and prevent operating the power switch 15. Accidental operation of the power switch of electronic devices, including products such as printers, can therefore be prevented.

12 Claims, 7 Drawing Sheets

PRINTER AND PRINTING SYSTEM

RELATED APPLICATIONS

The instant application claims the benefit of Japanese patent application Nos. 2013-151389 filed Jul. 22, 2013, and 2013-150219 filed Jul. 19, 2013, the entire disclosures of which are incorporated by reference herein.

BACKGROUND

1. Technical Field

The present disclosure relates to a printer and a printing system having a switch cover that covers and prevents accidental operation of a power switch.

2. Related Art

Printers that are installed at checkout counters in stores, for example, and are connected to peripheral devices such as credit card processing terminals, and have an integral print processing unit for printing, and a central processing unit with capabilities similar to a computer, are known from the literature. The operation processing unit runs driver software including a printer driver that controls driving the print processing unit, and device drivers that control driving the peripheral devices. An example of such a printer is disclosed in JP-A-2008-171303.

When the power switch of such a printer with a CPU turns on, a startup process is executed just like when the power switch of a computer turns on. More specifically, the CPU boots the operating system and loads the printer driver and device drivers to enable controlling and driving the print processing unit and peripheral devices connected to the printer. As a result, if the operator or customer accidentally touches and turns the power switch off in the middle of processing a customer transaction, time is taken for the printer to reboot and re-enable printing after the power switch is turned on again, making the customer wait.

SUMMARY

A printer and a printing system according to the present disclosure has a switch cover that covers and prevents accidental operation of the power switch.

A printer according to one aspect of the disclosure includes a print processing unit that prints; an operation processing unit that connects to the print processing unit and controls communication with the print processing unit; a case housing the operation processing unit and the print processing unit; a power switch that turns the power supply to the operation processing unit and the print processing unit on and off; a frame member that is fastened to the case and surrounds the power switch; and a cover member that is supported by the frame member movably between a closed position covering a window in the frame member so the power switch cannot be operated, and an open position where the power switch is not covered.

The printer in this aspect of the disclosure has a switch cover that can cover the power switch. Accidental operation of the power switch can therefore be prevented.

Preferably, the frame member has a pair of support parts opposing each other with the window therebetween; the cover member is disposed between the pair of support parts, and is pivotably supported by the pair of support parts on a pivot axis extending in the direction of opposition between the pair of support parts; the pivot axis passes through one end part of the cover member in a perpendicular direction that is perpendicular to the direction of the opening direction of the cover, the opening direction of the cover being perpendicular to the direction of opposition when the cover member is in the closed position; a pair of support pins protruding coaxially to the pivot axis toward the corresponding support part are disposed to the cover member; and a recess that pivotably supports the respective support pin is disposed to each support part.

This configuration enables using a simple configuration to swing the cover member between an open position and a closed position.

When the opposite end of the cover member as the pivot axis of the cover member is pulled by the operator to open the cover member, great force is applied to the cover member in the direction radially to the outside from the pivot axis. In this event, the support pins can be broken.

To solve this problem, the printer preferably has a first slope that slopes from the distal end of the support pin in a direction toward the other end of the cover member disposed to the support pin.

Because a first slope is disposed to each support pin in this configuration, when force is applied to the cover member in the direction radially to the outside from the pivot axis by the operator pulling on the cover member, the support pins can separate from the recesses. More specifically, because the first slope is formed in the direction to which the pulling force is applied to the support pin, the support pins can easily escape the recesses and separate from the recesses before the support pins are damaged. Damage to the support pins can therefore be avoided.

Further preferably, a second slope that slopes in a different direction than the first slope is disposed to the support pin.

When the cover member separates from the support parts, the second slope can be used to re-insert the support pins of the cover member into the recesses in the pair of support parts. The task of installing and supporting the cover member by the support parts is therefore simple. Damage to the support pins when installing the cover member can also be prevented.

Yet further preferably, the second slope slopes in a direction away from the window when the cover member is in the closed position.

This configuration enables supporting the cover member on the pair of support pins by holding the cover member with the back side that faces the opening when the cover member is in the closed position facing the opposite direction (away from the opening), and simply pushing the cover member into the frame member.

Further preferably, the printer has an engaging part that can catch the frame member disposed to the other end of the cover member in the perpendicular direction when the cover member is in the closed position.

This aspect of the invention holds the cover member stable in the closed position.

Further preferably, the printer also has a reset switch that resets the print processing unit.

When an error occurs in the printer and the printer becomes unable to print, the cause of the error may be in the print processing unit and not in the operation processing unit. In this event, print processing unit functionality can be restored without resetting the operation processing unit if there is a reset switch for resetting the print processing unit. If only the print processing unit is reset, the printing capabilities of the printer can be restored in less time than if the print processing unit and the operation processing unit are reset simultaneously. The print processing unit can also be reset while the operation processing unit continues processing operations.

In another aspect of the disclosure, the reset switch is preferably disposed to a position not covered by the cover member.

This configuration enables easily operating the reset switch. Furthermore, because the power switch remains covered by the cover member when the reset switch is operated, accidentally operating the power switch when operating the reset switch can be prevented.

In another aspect of the invention, the reset switch is preferably covered and cannot be operated when the cover member is in the closed position, and is not covered by the cover member when the cover member is in the open position.

This configuration can also prevent accidental operation of the reset switch.

Another aspect of the disclosure is a printing system, including a device that sends or receives data, and a printer. The printer includes a connection unit that connects to the device; a print processing unit that prints; an operation processing unit that controls communication with the print processing unit and the device connected to the connection unit; a case housing the operation processing unit and the print processing unit; a power switch that turns the power supply to the operation processing unit and the print processing unit on and off; a frame member that is fastened to the case and surrounds the power switch; and a cover member that moves between a closed position covering a window in the frame member so the power switch cannot be operated, and an open position where the power switch is not covered.

In the disclosure, the printer has a switch cover that can cover the power switch. Accidental operation of the power switch and the printer becoming unable to print can therefore be prevented.

In this aspect of the invention, the printer preferably has a reset switch that resets the print processing unit.

This configuration enables restoring the functionality of the print processing unit without resetting the operation processing unit. If only the print processing unit is reset, the printing capabilities of the printer can be restored in less time than if the print processing unit and the operation processing unit are reset at the same time. The print processing unit can also be reset while the operation processing unit continues processing operations.

Effect of the Invention

By simply fastening the switch cover of the disclosure to the surface of the case of an electronic device with the frame member surrounding the power switch, the cover member can cover and prevent operating the power switch. Accidental operation of the power switch can also be prevented in electronic devices to which the switch cover is disposed.

Other objects and attainments together with a fuller understanding of the invention will become apparent and appreciated by referring to the following description and claims taken in conjunction with the accompanying drawings.

DESCRIPTION OF EMBODIMENTS

A printer according to a preferred embodiment of the present invention is described below with reference to the accompanying figures.

Printer

Figure 1A:
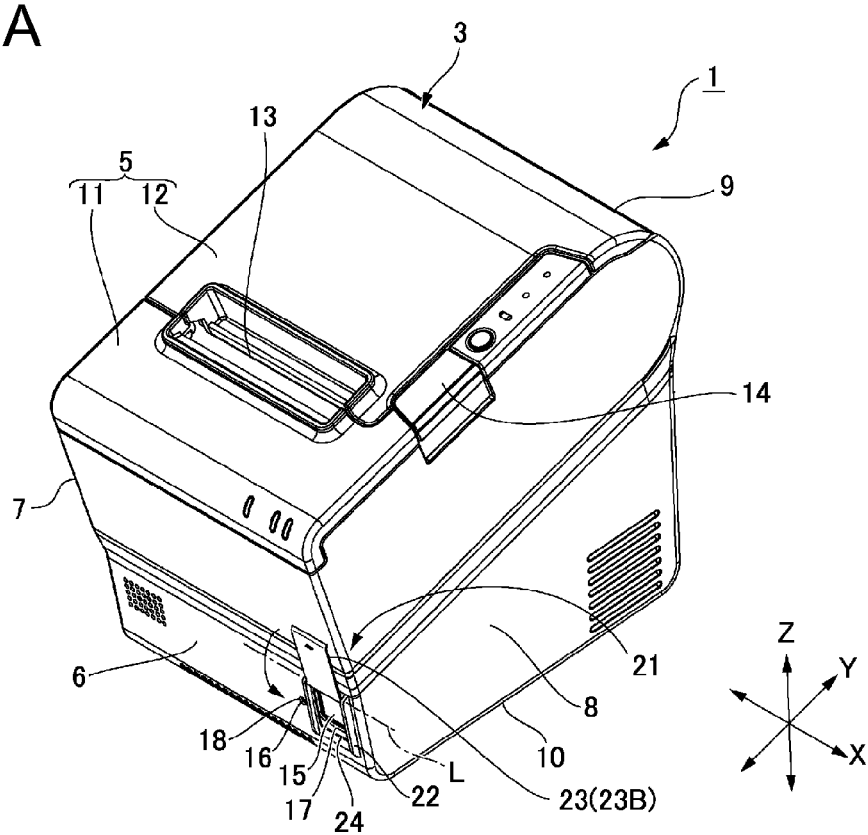
FIG. 1A is an oblique view.
Figure 1B:
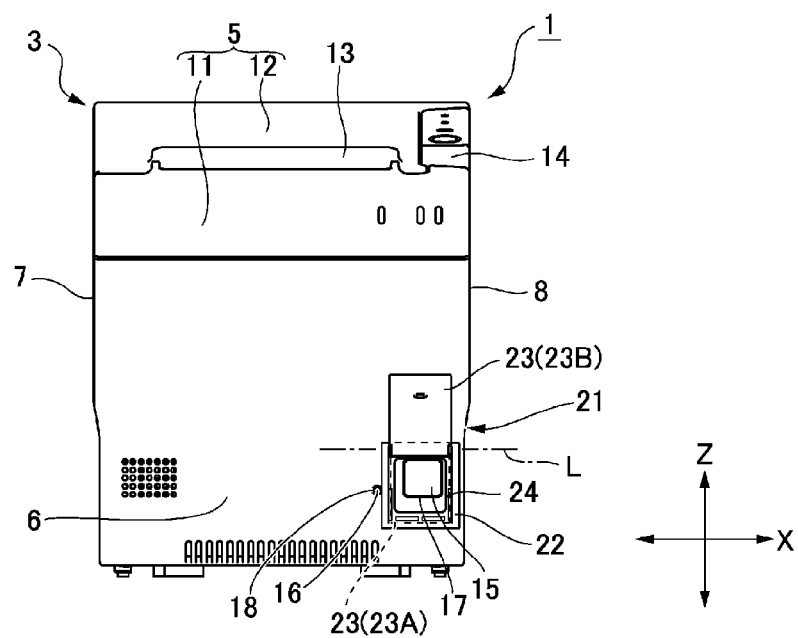
FIG. 1B is a front view of a printer according to the invention.

FIG. 1A is an oblique view of a printer according to the invention from diagonally above, and FIG. 1B is a front view of the printer. The printer 1 in this embodiment is a roll paper printer that is installed and used at a checkout counter in a store. The printer 1 prints receipts, for example, on continuous roll paper delivered from a paper roll stored inside the printer case 3. The printer is described below with reference to three perpendicular axes, an x-axis, y-axis, and z-axis. The x-axis is on the transverse axis across the width of the printer, the y-axis is the longitudinal axis between the front and back of the printer, and the z-axis is the vertical axis.

The printer case 3 is plastic. As shown in FIG. 1A, the printer case 3 includes a case top 5 that slopes down to the front of the printer on the y-axis; a case front 6 that slopes down to the back from the front edge of the case top 5, and then continues down; left and right case sides 7, 8 that extend down from the left and right edges of the case top 5 on the x-axis, curve slightly to the inside, and then continue down; a case back 9 that curves down to the back from the back edge of the case top 5, then extends down sloping forward; and a case bottom 10 defining the bottom of the printer case 3. The top edges of the left and right case sides 7, 8 continue to the left and right edges of the case top 5 on the x-axis, and the front edges continue to the left and right edges of the case front 6 on the x-axis. The back edges of the left and right case sides 7, 8 continue to the left and right edges of the case back 9 on the x-axis, and the bottom edges continue to the left and right edges of the case bottom 10 on the x-axis.

A front access cover 11 and a back access cover 12 are attached to the case top 5 of the printer case 3. The front access cover 11 can open and close pivoting on the front end part thereof, and the back access cover 12 can open and close pivoting on the back end part thereof.

A rectangular paper exit 13 of a specific width is formed between the front access cover 11 and back access cover 12.

An opener button 14 for opening and closing the back access cover 12 is disposed to the edge of the case top 5 on the right side of the paper exit 13 on the x-axis. Pushing down on the opener button 14 unlocks the back access cover 12, allowing the back access cover 12 to swing up and open due to an urging force such as spring force. Opening the back access cover 12 also opens the roll paper compartment where the roll paper is stored, and enables loading a paper roll into the roll paper compartment.

A power switch 15 and a reset switch 16 are disposed to the case front 6 of the printer case 3. Pressing the power switch 15 alternately turns the power on and off.

A rectangular power switch window 17 is formed in the case front 6, and the operating surface of the power switch 15 is positioned inside the power switch window 17.

The reset switch 16 is located on the right side of the middle of the case front 6 on the x-axis, and on the left side of the power switch 15 on the x-axis. A reset switch window 18 is also formed in the case front 6, and the operating surface of the reset switch 16 is positioned inside the reset switch window 18.

The reset switch window 18 is round and smaller than the power switch window 17. The reset switch 16 is operated by the operator depressing it with the tip of a pen, for example.

A switch cover 21 that can cover the power switch 15 is attached to the case front 6. The switch cover 21 includes a frame member 22 affixed to the case front 6 and surrounding the power switch 15, and a cover member 23 supported pivotably by the frame member 22. The frame member 22 is fastened by adhesive to the case front 6, and the switch cover 21 is thereby fastened to the printer case 3. The cover member 23 swings on a pivot axis L extending on the x-axis above the opening 24 on the inside of the frame member 22.

The opening 24 in the frame member 22 is larger than the power switch window 17. As shown in FIG. 1B, the switch cover 21 is fastened to the case front 6 with the top edge of the opening 24 in the frame member 22 aligned with the top edge of the power switch window 17. The reset switch 16 is positioned outside the frame member 22, and is separated from the switch cover 21. More specifically, the reset switch 16 is at a position not covered by the cover member 23.

The cover member 23 can move between a closed position 23A indicated by the dotted line in FIG. 1B where the opening 24 in the frame member 22 is closed and the power switch 15 is covered and cannot be operated, and an open position 23B indicated by the solid line in FIG. 1B where the opening 24 is open and the power switch 15 is uncovered.

To move the cover member 23 from the open position 23B to the closed position 23A, the operator rotates the cover member 23 forward as indicated by the arrow in FIG. 1A. When the cover member 23 is in the open position 23B, the pivot axis L passes through the bottom of the cover member 23 on the x-axis. The cover member 23 set to the open position 23B therefore moves of its own weight to the closed position 23A. When the cover member 23 is in the closed position 23A, the pivot axis L passes through the top of the cover member 23 on the x-axis.

The switch cover 21 is described in further detail below.

Control System

Figure 2:
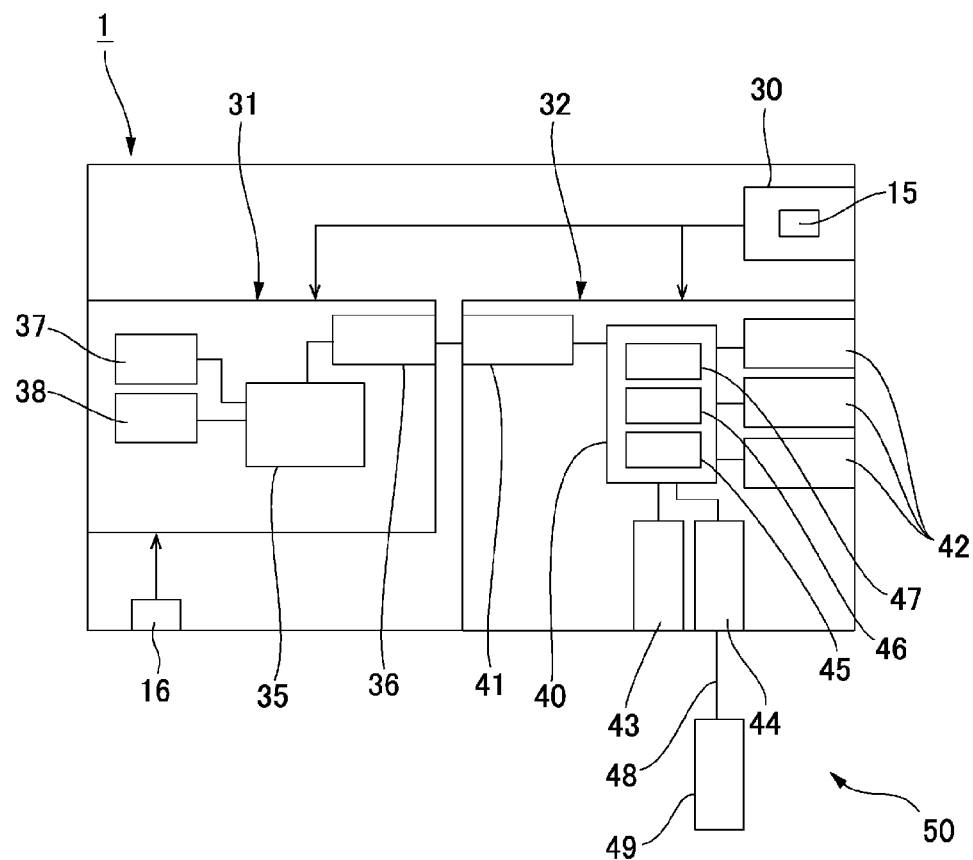
FIG. 2 is a block diagram of the printer in FIG. 1.

FIG. 2 is a block diagram illustrating the control system of the printer 1. The printer 1 has a power control unit 30 that receives DC power of a specific voltage from an external source; a print processing unit 31 that prints; and an operation processing unit 32 that controls driving the print processing unit 31.

The power control unit 30 includes the power switch 15, and when the power turns on by operating the power switch 15, the power control unit 30 supplies the power supplied from the external source to the print processing unit 31 and operation processing unit 32.

The print processing unit 31 is configured around a print control unit 35 including a CPU, ROM, RAM, and other peripheral circuits, for example. A communication interface 36 is connected to the input side of the print control unit 35. A printhead 37 and paper feed motor 38 are connected to the output side of the print control unit 35. The paper feed motor 38 is the drive source of the paper feed mechanism that conveys continuous recording media delivered from the paper roll through a conveyance path passing the printhead 37.

The operation processing unit 32 has the functions similar to a personal computer, and is configured around a central processing unit 40 including a CPU, ROM, RAM, and necessary peripheral circuits. A communication interface 41, plural USB ports 42, VGA connector 43, and network connector 44 are connected to the central processing unit 40.

The communication interface 41 of the operation processing unit 32 is connected to the communication interface 36 of the print processing unit 31, thereby enabling the operation processing unit 32 and print processing unit 31 to communicate.

The USB ports 42, VGA connector 43, and network connector 44 are disposed to a connector panel (not shown in the figure) disposed to the case back 9. A tablet terminal 49 (not shown in the figure) can connect to the network connector 44 through a network cable 48. When the tablet terminal 49 is connected to the network connector, the central processing unit 40 can control communication through the network connector 44, and print data, for example, can be supplied from the tablet terminal 49 to the operation processing unit 32 by data communication between the tablet terminal 49 and the operation processing unit 32. In this event, the tablet terminal 49 and printer 1 form a printing system 50.

The central processing unit 40 includes an OS execution unit 45 that runs an operating system (OS), a printer driver execution unit 46 that runs a printer driver (driver software) to control driving the print processing unit 31, and a device driver execution unit 47 that runs a device driver (driver software) to control driving a peripheral device connected to the USB ports 42.

The reset switch 16 inputs a reset signal to the print processing unit 31. The reset switch 16 is pressed when an unrecoverable error occurs and the printer 1 becomes unable to print. When the reset switch 16 is pressed and the reset signal is input to the print processing unit 31, the print processing unit 31 is reset. As a result, the print processing unit 31 can function normally again. Note that resetting is an initialization operation that returns the print processing unit 31 to the same state entered when the power turns on. Only the print processing unit 31 is reset when the reset switch 16 is pressed; the operation processing unit 32 is not reset.

As described above, the printer 1 according to this embodiment has a switch cover 21 that can cover the power switch 15 so that the power switch 15 cannot be operated. Accidental operation of the power switch 15 can therefore be prevented.

The reset switch 16 is disposed to a position where it is not covered by the cover member 23. Operating the reset switch 16 is therefore easy. Because the power switch 15 can remain covered by the cover member 23 when the operator operates the reset switch 16, accidental operation of the power switch 15 can be prevented when the reset switch 16 is operated.

Switch Cover

Figure 3A:
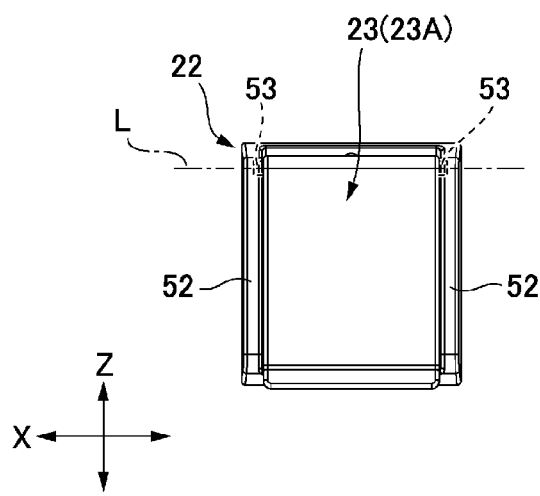
FIGS. 3A-3D illustrate the switch cover.
Figure 3C:
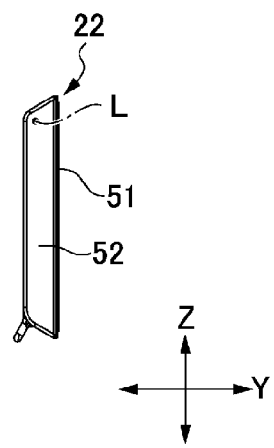
Figure 3B:
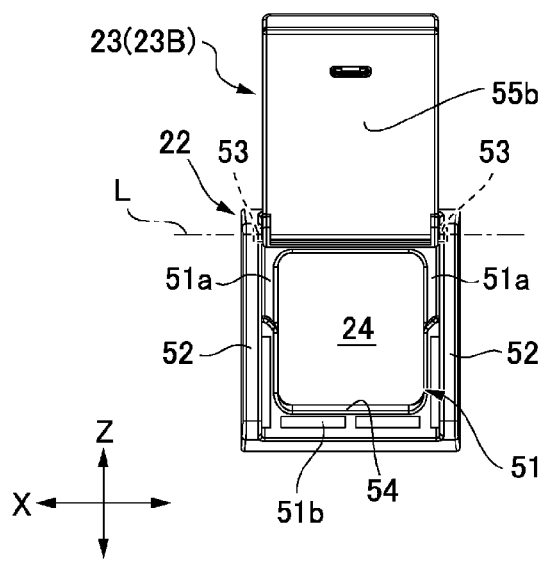
Figure 3D:
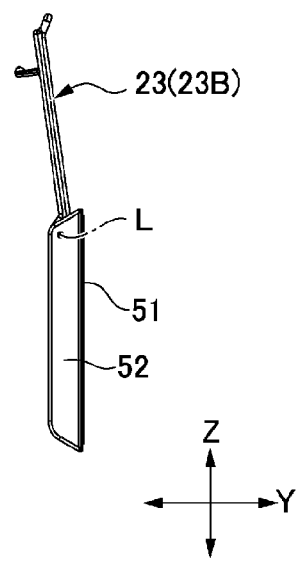
Figure 4A:
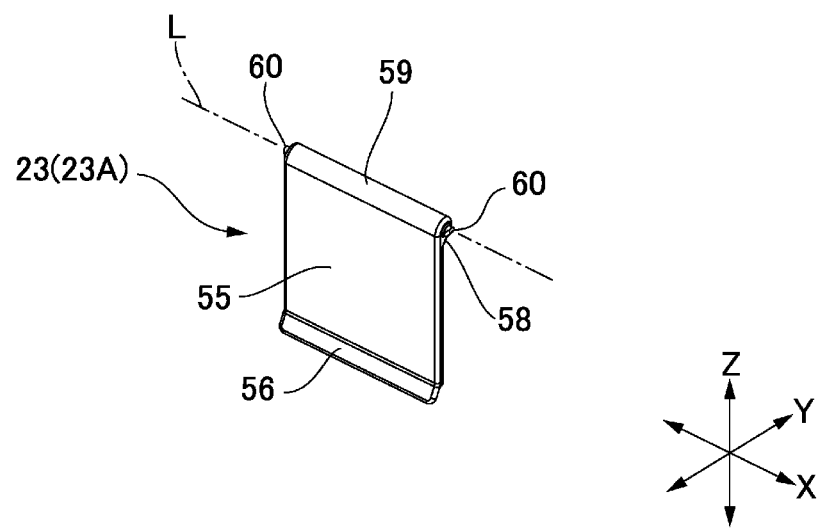
FIG. 4A and FIG. 4B are oblique views of the cover member.
Figure 4B:
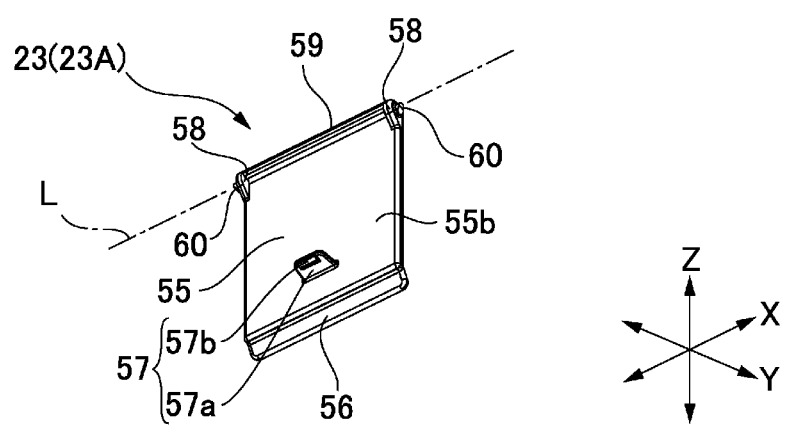
Figure 5A:
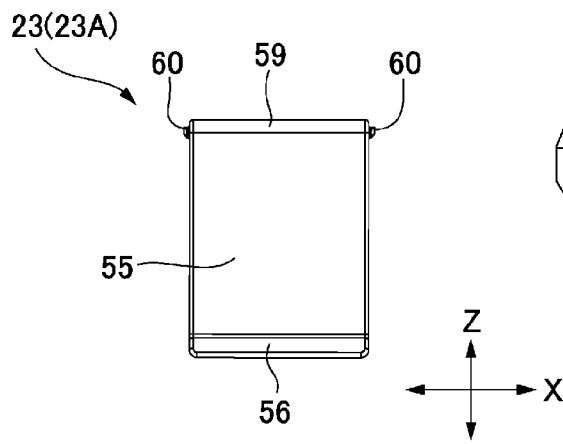
FIGS. 5A-5F describe the cover member.
Figure 5D:
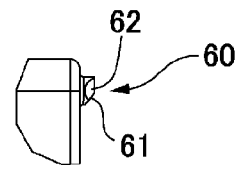
Figure 5B:
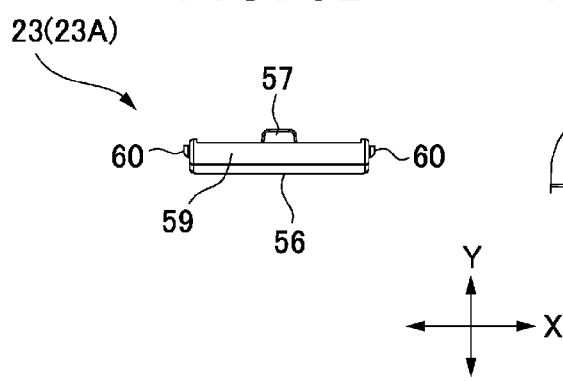
Figure 5E:
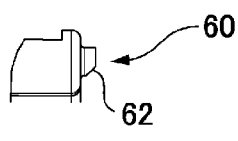
Figure 5C:
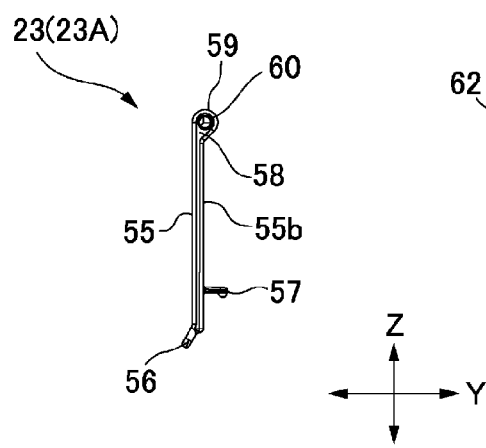
Figure 5F:
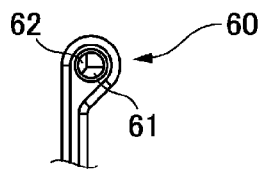

The switch cover 21 is described in detail below. Note that the switch cover 21 is described below referenced to the switch cover 21 being fastened to the printer 1. The x-axis is therefore aligned with the width of the switch cover 21, the y-axis goes through the front and back of the switch cover 21, and the z-axis is aligned with the vertical axis of the switch cover 21. FIG. 3(a) shows a front view and a side view of the switch cover 21 when the cover member 23 is in the closed position 23A, and FIG. 3(b) shows a front view and a side view of the switch cover 21 when the cover member 23 is in the open position 23B. FIG. 4(a) is an oblique view of the cover member 23 from diagonally above the front, and FIG. 4(b) is an oblique view of the cover member 23 from diagonally below the back. FIG. 5(a) is a front view of the cover member 23 and an enlarged view of the area around the support pin, FIG. 5(b) is a top view of the cover member 23 and an enlarged view of the area around the support pin, and FIG. 5(c) is a side view of the cover member 23 and an enlarged view of the area around the support pin.

The switch cover 21 comprises the frame member 22 and cover member 23. Both the frame member 22 and cover member 23 are plastic. As shown in FIG. 3(b), the frame member 22 has a frame part 51 in which the opening 24 is formed in the center, and a pair of support parts 52 that extend forward on the y-axis from the vertical portions 51*a* of the frame part 51 with the opening 24 therebetween on the x-axis. A step 54 that projects forward is disposed to the bottom portion 51*b* located below the opening 24 in the frame part 51.

The back of the frame part 51 is flat, and is the fastening surface that is fastened to the case front 6 of the printer case 3. The pair of support parts 52 are opposite each other on the x-axis with the opening 24 therebetween, and extend on the z-axis through the full length of the vertical portions 51*a*. The pivot axis L passes through the top end parts of the pair of support parts 52 above the opening 24. Round recesses 53 that are recessed on the x-axis are disposed coaxially to the pivot axis L at the top ends on the z-axis of the opposite inside surfaces of the pair of support parts 52. The shape of the frame member 22 as seen from the x-axis is a trapezoid with the bases extending on the z-axis, and the short base located forward on the y-axis from the long base.

As shown in FIG. 3, the cover member 23 is disposed between the pair of support parts 52 on the x-axis. As shown in FIG. 3(*a*), when the cover member 23 is in the closed position 23A, the pivot axis L passes through the top end part of the cover member 23 (one end part of the cover member) on the z-axis (vertical axis). When the cover member 23 is in the open position 23B, the pivot axis L passes through the bottom end part of the cover member 23 on the z-axis as shown in FIG. 3(*b*).

As shown in FIG. 4, the cover member 23 has a rectangular cover body 55 that is in the middle on the z-axis when the cover member 23 is in the closed position 23A. The cover body 55 is a flat panel of a constant thickness. A flat grip 56 that slopes down to the front continuously from the bottom edge of the cover body 55 is disposed at the bottom of the cover body 55. When the cover member 23 is in the closed position 23A, the cover body 55 covers the opening 24 with the back 55*b* facing the opening 24.

A hook 57 (engaging part) is disposed to the back 55*b* of the cover body 55. The hook 57 extends to the back on the y-axis when the cover member 23 is in the closed position 23A. The hook 57 has a flat part 57*a* disposed with the thickness thereof on the z-axis when the cover member 23 is in the closed position 23A, and a protrusion 57*b* projecting down from the middle on the x-axis at the back end of the flat part 57*a* on the y-axis.

A pair of projections 58 projecting to the back on the y-axis when the cover member 23 is in the closed position 23A are disposed to the opposite ends of the top part of the cover body 55 on the x-axis. The pair of projections 58 are flat with the thickness thereof on the x-axis. A connector panel 59 that connects the pair of projections 58 extends on the x-axis above the pair of projections 58. The connector panel 59 curves up to the back continuously from the top end of the cover body 55.

A support pin 60 is disposed protruding on the x-axis from the outside surfaces of the pair of projections 58. The cover member 23 is supported by the frame member 22 pivotably on the pivot axis L by the pair of support pins 60 protruding from the pair of projections 58 being inserted to the respective recesses 53 disposed in the pair of support parts 52 of the frame member 22.

As shown in FIG. 5(*a*) and FIG. 5(*c*), a first slope 61 is formed on each support pin 60. When the cover member 23 is in the closed position 23A, this first slope 61 slopes in the direction away from the distal end of the support pin 60 in the direction (the direction toward the grip 56) toward the bottom end (the opposite end of the cover member) of the cover member 23. As shown in FIG. 5(*b*) and FIG. 5(*c*), a second slope 62 is also disposed to each support pin 60. When the cover member 23 is in the closed position 23A, this second slope 62 slopes to the front (the direction away from the opening 24) in the direction away from the distal end of the support pin 60.

Opening and Closing the Switch Cover, and Installing the Cover Member

Figure 6A:
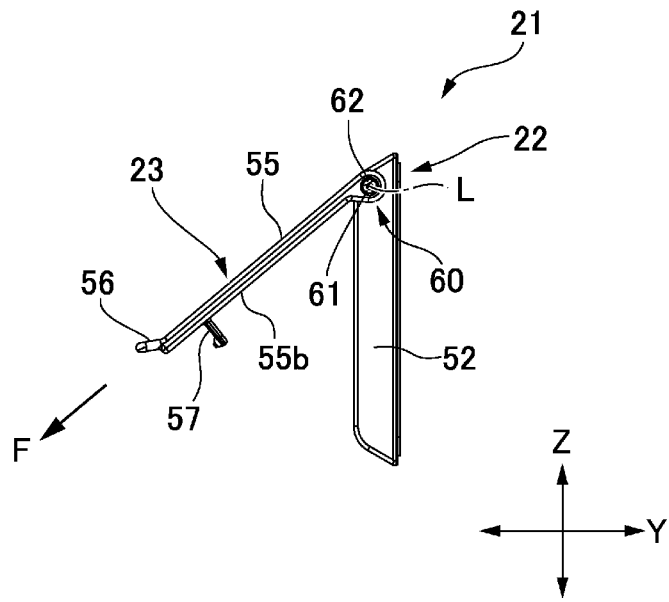
FIG. 6A and FIG. 6B describe the opening and closing operation of the switch cover.
Figure 6B:
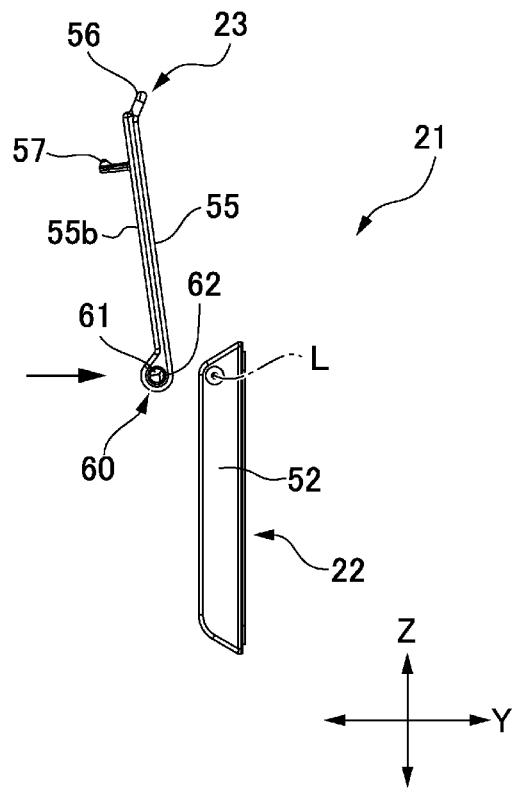

FIG. 6(*a*) illustrates opening the switch cover 21 and FIG. 6(*b*) illustrates installing the cover member 23. One support part 52 of the frame member 22 is omitted in FIG. 6 so that the directions in which the first slope 61 and the second slope 62 slope can be understood.

As shown in FIG. 1, the switch cover 21 is fastened to the printer case 3 for use. More specifically, the back of the frame part 51 is bonded to the case front 6 with the frame member 22 surrounding the power switch 15. When the switch cover 21 is closed, the cover member 23 is in the closed position 23A, covering the power switch 15 so that the power switch 15 cannot be operated.

When the cover member 23 is in the closed position 23A, the cover body 55 covers the opening 24 from the front as shown in FIG. 3(*a*). In this position the cover body 55 is fit into the space inside the pair of support parts 52, and only the grip 56 protrudes forward from the pair of support parts 52. When the cover member 23 is in the closed position 23A, the hook 57 disposed to the back 55*b* of the cover body 55 is also engaged with the step 54 of the frame member 22. The cover member 23 is therefore stable in the closed position 23A.

To open the switch cover 21, the operator pulls the grip 56 of the cover member 23 forward, and then rotates the cover member 23 up 180 degrees on the pivot axis L. This action sets the cover member 23 to the open position 23B. Because the opening 24 in the frame member 22 is open when the cover member 23 is in the open position 23B, the power switch 15 is no longer covered by the cover member 23, and the operator can operate the power switch 15. When the cover member 23 is in the open position 23B, the back 55*b* of the cover body 55 faces the front on the y-axis as shown in FIG. 3(*b*).

As indicated in FIG. 6(*a*), when the operator pulls the grip 56 of the cover member 23 forward to open the switch cover 21, a strong force F is applied to the cover member 23 radially to the outside from the pivot axis L. It is possible for the support pins 60 to break in this event.

Because the first slope 61 is disposed to each support pin 60 in this embodiment to solve this problem, when force F is applied to the cover member 23 in the direction radially to the outside from the pivot axis L by the operator pulling on the cover member 23, the support pins 60 separate from the recesses 53. More specifically, because the first slope 61 is formed in the direction to which pulling force F is applied to the support pin 60, the support pins 60 can easily escape the recesses 53 and separate from the recesses 53 before the support pins 60 are damaged. Damage to the support pins 60 can therefore be avoided.

When the support pins 60 escape the recesses 53 and the cover member 23 separates from the frame member 22, the second slope 62 can be used to re-insert the support pins 60 of the cover member 23 into the recesses 53 in the pair of support parts 52. More specifically, the operator sets the second slope 62 facing the frame member 22 side with the back 55*b* of the cover member 23 facing away from the opening 24 as shown in FIG. 6(*b*). The cover member 23 is then pushed into the frame member 22 with the support pins 60 of the cover member 23 at the same elevation on the z-axis as the recesses 53 in the pair of support parts 52 of the frame member 22. As a result, because the support pins 60 are inserted to the recesses 53 from the second slope 62 side, the task of installing and supporting the cover member 23 by the support parts 52 is simple. Damage to the support pins 60 when installing the cover member 23 can also be prevented.

Other Embodiments

The direction of the second slope 62 disposed to each support pin 60 may be any direction that is different from the direction of the first slope 61 and slopes away from the pivot axis L in a direction away from the distal end of the support pin 60.

Further alternatively, the pair of support parts 52 could pivotably support the cover member 23 by disposing a support pin protruding toward the cover member 23 on each of the support parts 52, and forming recesses that can receive the support pins in the cover member 23. If one of the support pins breaks when this configuration is used, however, the switch cover 21 cannot be repaired without replacing the frame member 22, which is fastened to the printer case 3. A configuration in which the support pins 60 are disposed to the cover member 23 is therefore preferable.

Further alternatively, the switch cover 21 may be provided with double-sided tape having one side of the tape affixed to the surface of the frame member 22 that fastens to the printer case 3. In this configuration, the switch cover 21 can be fastened to the printer case 3 by double-sided tape.

Further alternatively, a configuration in which the reset switch 16 is covered by the cover member 23 so that it cannot be operated when the cover member 23 is in the closed position 23A, and is uncovered by the cover member 23 when the cover member 23 is in the open position 23B, is also conceivable.

Figure 7:
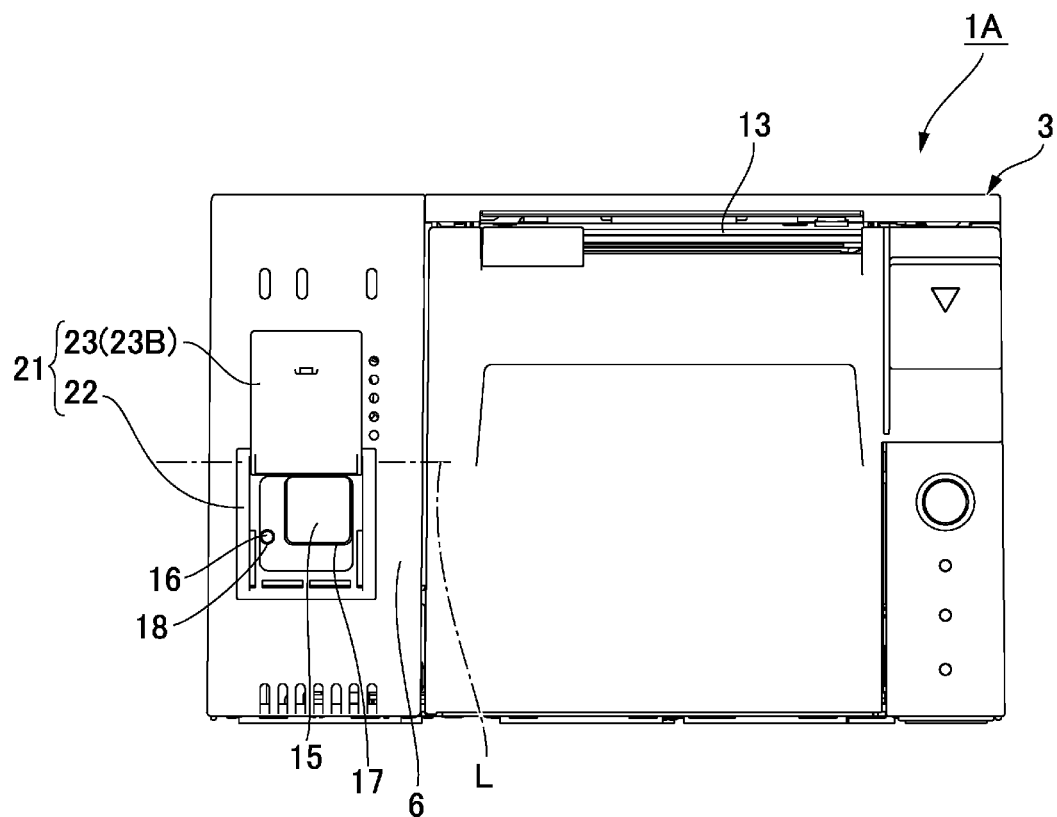
FIG. 7 is a front view of another example of a printer with the switch cover.

FIG. 7 is a front view of another example of a printer with the switch cover 21 according to the invention. Note that parts of the printer 1A shown in FIG. 7 that corresponding to like parts in the printer 1 are identified by like reference numerals, and further description thereof is omitted.

In the printer 1A shown in FIG. 7, the frame member 22 surrounds both the power switch 15 and the reset switch 16 when the switch cover 21 is fastened to the case front 6 of the printer case 3. This configuration prevents accidental operation of both the power switch 15 and reset switch 16.

The pivot axis L on which the pair of support parts 52 pivotably support the cover member 23 is on the x-axis in the foregoing embodiment, but the switch cover 21 may be attached to the printer case 3 so that the switch cover 21 swings horizontally and the pivot axis L is on the z-axis.

The pair of support parts 52 of the frame member 22 support the cover member 23 pivotably in the foregoing example, but a configuration in which the pair of support parts 52 support the cover member 23 slidably on the z-axis, and the cover member 23 can move between the up open position 23B and the down closed position 23A, is also conceivable.

Note that the switch cover 21 is described as used with a printer 1 in the foregoing embodiment, but the switch cover 21 of the invention may be disposed to a scanner, facsimile machine, copier, power supply device, or other electronic device to prevent accidental operation of the power switch 15.

The invention being thus described, it will be obvious that it may be varied in many ways. Such variations are not to be regarded as a departure from the spirit and scope of the invention, and all such modifications as would be obvious to one skilled in the art are intended to be included within the scope of the following claims.

What is claimed is:

1. A printer comprising:
a print processing unit that prints;
an operation processing unit that connects to the print processing unit and controls communication with the print processing unit;
a case housing the operation processing unit and the print processing unit;
a power switch that turns the power supply to the operation processing unit and the print processing unit on and off;
a frame member that is fastened to the case and surrounds the power switch; and
a cover member that is supported by the frame member movably between a closed position covering a window in the frame member so the power switch cannot be operated, and an open position where the power switch is not covered.

2. The printer described in claim 1, wherein:
the frame member has a pair of support parts opposite each other with the window therebetween;
the cover member is disposed between the pair of support parts, and is pivotably supported by the pair of support parts on a pivot axis extending in the direction of opposition between the pair of support parts;
the pivot axis passes through one end part of the cover member in a perpendicular direction that is perpendicular to the direction of an opening direction of the cover, the opening direction of the cover being perpendicular to the direction of opposition when the cover member is in the closed position;
a pair of support pins protruding coaxially to the pivot axis toward the corresponding support part are disposed to the cover member; and
a recess that pivotably supports the respective support pin is disposed to each support part.

3. The printer described in claim 2, wherein:
a first slope that slopes from the distal end of the support pin in a direction toward the other end of the cover member is disposed to the support pin.

4. The printer described in claim 3, wherein:
a second slope that slopes in a different direction than the first slope is disposed to the support pin.

5. The printer described in claim 4, wherein:
the second slope slopes in a direction away from the window when the cover member is in the closed position.

6. The printer described in claim 2, wherein:
an engaging part that can catch the frame member disposed to the other end of the cover member in the perpendicular direction when the cover member is in the closed position.

7. The printer described in claim 1, further comprising:
a reset switch that resets the print processing unit.

8. The printer described in claim 7, wherein:
the reset switch is disposed to a position not covered by the cover member.

9. The printer described in claim 7, wherein:
the reset switch is covered and cannot be operated when the cover member is in the closed position, and is not covered by the cover member when the cover member is in the open position.

10. A printing system, comprising:
a device that sends or receives data; and
a printer including a connection unit that connects to the device,
a print processing unit that prints, an operation processing unit that controls communication with the print processing unit and the device connected to the connection unit, a case housing the operation processing unit and the print processing unit, a power switch that turns the power supply to the operation processing unit and the print processing unit on and off, a frame member that is fastened to the case and surrounds the power switch, and a cover member that moves between a closed position covering a window in the frame member so the power switch cannot be operated, and an open position where the power switch is not covered.

11. The printing system described in claim 10, wherein: the printer has a reset switch that resets the print processing unit.

12. A printer comprising:

a print processing unit that prints;

an operation processing unit that connects to the print processing unit and controls communication with the print processing unit;

a case housing the operation processing unit and the print processing unit;

a power switch that turns the power supply to the operation processing unit and the print processing unit on and off;

a frame member that is fastened to the case and surrounds the power switch; and a cover member that is supported by the frame member movably between a closed position covering a window in the frame member so the power switch cannot be operated, and an open position where the power switch is not covered, wherein:

the frame member has a pair of support parts opposite each other with the window therebetween;

the cover member is disposed between the pair of support parts, and is pivotably supported by the pair of support parts on a pivot axis extending in the direction of opposition between the pair of support parts;

the pivot axis passes through one end part of the cover member in a perpendicular direction that is perpendicular to the direction of an opening direction of the cover, the opening direction of the cover being perpendicular to the direction of opposition when the cover member is in the closed position;

a pair of support pins protruding coaxially to the pivot axis toward the corresponding support part are disposed to the cover member;

a recess that pivotably supports the respective support pin is disposed to each support part;

a first slope that slopes from the distal end of the support pin in a direction toward the other end of the cover member is disposed to the support pin;

a second slope that slopes in a different direction than the first slope is disposed to the support pin; and the second slope slopes in a direction away from the window when the cover member is in the closed position.

\* \* \* \* \*